United States Patent
Durst et al.

[11] Patent Number: 5,902,402
[45] Date of Patent: May 11, 1999

[54] DEVICE FOR CHEMICAL WET TREATMENT

[75] Inventors: Johann Durst; Holger Sigel, both of Pliezhausen; Werner Schulz, Aalen, all of Germany

[73] Assignee: Steag Microtech GmbH, Donaueschingen, Germany

[21] Appl. No.: 08/875,408

[22] PCT Filed: Dec. 29, 1995

[86] PCT No.: PCT/EP95/05153

§ 371 Date: Jul. 3, 1997

§ 102(e) Date: Jul. 3, 1997

[87] PCT Pub. No.: WO96/21241

PCT Pub. Date: Jul. 11, 1996

[30] Foreign Application Priority Data

Jan. 5, 1995 [DE] Germany .......................... 195 00 239
Dec. 15, 1995 [DE] Germany .......................... 195 46 990

[51] Int. Cl.⁶ .................................................. B05C 3/00
[52] U.S. Cl. ............................... 118/423; 118/58; 118/61; 118/63; 118/64; 118/428; 118/429; 118/501; 118/602; 118/DIG. 2; 427/430.1; 414/937; 414/940; 414/941; 134/61; 134/902
[58] Field of Search .................. 118/58, 61, 63, 118/64, 423, 428, 429, 501, 602, DIG. 2; 427/430.1; 414/937, 940, 941; 134/61, 902

[56] References Cited

U.S. PATENT DOCUMENTS

| | | |
|---|---|---|
| 3,493,093 | 2/1970 | Hammer et al. . |
| 3,611,987 | 10/1971 | Kohler et al. ............................ 118/126 |
| 4,267,857 | 5/1981 | Van Haaften ............................ 137/119 |
| 4,963,069 | 10/1990 | Wurst et al. . |
| 5,299,901 | 4/1994 | Takayama . |
| 5,301,700 | 4/1994 | Kamikawa et al. . |
| 5,381,808 | 1/1995 | Kamikawa ............................... 134/61 |
| 5,569,330 | 10/1996 | Schild et al. ............................ 134/902 |

FOREIGN PATENT DOCUMENTS

| | | |
|---|---|---|
| 0385536 | 9/1990 | European Pat. Off. . |
| 0523836 | 1/1993 | European Pat. Off. . |
| 2586658 | 3/1987 | France . |
| 3425267 | 1/1985 | Germany . |
| 4232183 | 3/1994 | Germany . |
| 4332857 | 4/1994 | Germany ................................ 134/902 |
| 2-98956 | 4/1990 | Japan ..................................... 414/937 |
| 2-130827 | 5/1990 | Japan ..................................... 134/61 |
| 4-294535 | 10/1992 | Japan ..................................... 134/902 |
| 5270660 | 10/1993 | Japan . |
| 5-326476 | 12/1993 | Japan ..................................... 134/902 |
| 6-80208 | 3/1994 | Japan ..................................... 414/941 |
| 2178594 | 2/1987 | United Kingdom . |

*Primary Examiner*—Peter Chin
*Assistant Examiner*—Michael P. Colaianni
*Attorney, Agent, or Firm*—Robert W. Becker & Associates

[57] ABSTRACT

A device for chemical wet treatment of substrates has a tank containing a treatment fluid for treating the substrates. At least one substrate carrier for supporting the substrates within the tank is provided. At least one substrate lifting device for lifting the substrates off the substrate carrier is provided. A lifting apparatus for lifting and lowering the substrate carrier is positioned in the tank. The lifting apparatus has a first transport carriage connected to the substrate lifting device and a second transport carriage connected to a holder of the substrate carrier. The first and second transport carriages are connected to one another by a jointed connection.

19 Claims, 12 Drawing Sheets

DEVICE FOR CHEMICAL WET TREATMENT

BACKGROUND OF THE INVENTION

The present invention relates to a device for chemical wet treatment of substrates in a tank containing a treatment fluid, with a lifting apparatus for introducing and removing at least one substrate carrier and the substrates, as well as a drying method which uses such a lifting device.

At present, an automatic wet treatment device comprises a number of containers or tanks for a sequence of chemical wet processes. After completion of a chemical process sequence or between process steps, substrates, for example, silicone wafers arranged in a cassette, are submerged into a rinsing tank and subsequently dried.

The drying of a substrate can, for example, be performed with a centrifuge, but also during the slow removal of the substrate from the rinsing tank.

From European document 0 385 536 a drying method is known in which, in addition to the slow removal of the substrate, a vapor originating from a bath is applied to the substrate whereby the vapor does not condense on the substrate but diffuses into the liquid. At the liquid meniscus on the substrate surface a concentration gradient is produced, and thus a surface tension gradient, which causes the movement of the liquid away from the substrate into the liquid and thus results in the drying of the substrate without residue. During the chemical wet treatment, respectively, the rinsing and drying, the substrates are secured in carriers, also called wafer cassettes, in slots which are formed on the inner surface of the sidewalls of the cassette. Such standard carriers especially have relatively large surfaces with edges and corners so that a relatively large amount of chemicals is transferred from one process tank into another, respectively from one bath into another, thus making the drying process more difficult. The edges and great surface areas of conventional carriers prolong especially the respective cleaning, rinsing, and drying steps during the treatment because relatively large amounts of liquid adhere to the surfaces, edges and corners and the removal of chemicals by rinsing is more complicated. However, when the carrier does not have lateral guides, there are no lateral guides provided for the substrates during lifting. In the known devices the lateral carrier guides are used to secure the substrates during lifting from the bath in order to protect the substrates during lifting from the carrier against tipping over.

From Japanese document 5-27 06 60 (A) a device of the aforementioned kind is known in which a lifting device with a transport carriage for introducing and removing the substrates and substrate carrier into and from a container for chemical wet treatment is provided. As in the case of introduction and removal disclosed in connection with the arrangement of European document 0 385 536 A, the substrates remain within the carrier so as to be removed and introduced together with the carrier.

From U.S. Pat. No. 5,299,901 a substrate handling device is known in which a first transport carriage moves a carrier for the substrates and a second transport carriage moves the substrate into and out of the carrier. The introduction and removal of the substrates, respectively, the substrates carriers into and from a container for chemical wet treatment of substrates and the associated requirements and difficulties are not discussed in this document.

From U.S. Pat. No. 4,963,069 a substrate handling device is known in which a substrate carrier is moved up and down with a lifting apparatus and, in addition, a piston-cylinder unit with a jointed connection to the lifting rod is provided in order to disengage the substrate carrier from the lifting movement.

From German Patent 34 25 267 a device for transporting and individually handling substrates is known according to which the substrates within the substrate carrier can be lifted and the substrates can also be lifted out of the carrier.

U.S. Pat. No. 3,493,093 shows and discloses a transporting and handling device with which objects can be lifted and transported whereby a control curve is used.

It is an object of the invention to provide a device, respectively, a method for the chemical wet treatment, especially for a rinsing and/or drying, with which a continuous and secure lifting, respectively, lowering of the substrates is possible.

SUMMARY OF THE INVENTION

The aforementioned object is inventively solved by providing the lifting apparatus with a first transport carriage for the substrate and a second transport carriage for the substrate carrier which transport carriages are connected with one another by a jointed connection. With this embodiment a separate lifting control for the substrates and the substrate carrier and thus an optimal adaptation of the movement to the respective process requirements is possible. Such a connection with the possibility of a relative movement of the carriages relative to one another results in an optimal adaptation of the movements of the two carriages and thus of the substrate and the substrate carrier. The inventive features and measures allow the continuous removal of the carrier with the substrates contained therein and the subsequent lifting of the substrates from the carrier without requiring a standstill or a great reduction of the velocity of the carrier to be lifted during this entire process, especially also during the switching between the movement of the carrier itself to the movement of the substrate relative to the carrier. In the treatment of carriers, especially of wafers, it is especially very important that a standstill during the lifting of the wafers from the treatment, rinsing, or cleaning bath does not occur because otherwise, upon interruption of the movement, in the area of the transition from the liquid into the space above the liquid surface, particles may deposit on the wafer. Due to the differential stroke between the carrier and the substrates provided for by the inventive measures, a continuous movement of the substrates out of the liquid, and especially during passing through the liquid surface, is thus possible.

Advantageous embodiments of the invention are disclosed in the dependent claims.

Preferably, the first transport carriage is connected to a drive device. The second transport carriage is not independently driven but instead coupled to the first transport carriage.

According to a further advantageous embodiment of the invention, the jointed connection comprises two legs whereby a first leg is connected to the first transport carriage and a second leg is connected pivotably to the second transport carriage. The ends of the legs which face away from the transport carriages are pivotably connected to one another by a pin.

Advantageously, a projecting portion of the pin which connects the two legs runs along a control curve. The control curve thus determines the course of movement of the connecting point of the two legs. By suitably selecting the control curve, it is thus possible to effect the movement of the first and second transport carriages together or independent of one another. This realizes a differential stroke which in the beginning moves the substrate carrier and the substrates together at the same velocity, and subsequently stops the movement of the substrate carrier while the substrates are moved farther. Due to the connection of the substrate carrier without lateral guides, which are also known under the name "low mass carrier" or "low profile carrier", with such a differential lifting mechanism, fixedly installed substrate carrier receivers within the container are no longer required which are however necessary for processing conventional carriers.

Advantageously, the control curve comprises a straight section extending parallel to the direction of movement and an adjacent curved section connected to the straight section.

According to another advantageous embodiment, the distance between the first and second transport carriers, and thus between the substrate and the substrate carrier, is enlarged when the pin runs along the curved section. Due to the enlargement of the distance between the substrates and the substrate carrier, the substrates are lifted from the substrate carrier.

Advantageously, the shape of the curved section is selected such that the distance between the first and second transport carriages increases constantly. This ensures a constant lifting velocity of the substrates so that drying spots and particle deposits at the substrates due to jarring movements or even standstill can be securely prevented.

Advantageously, the form of the curved section in its end section is selected such that the second transport carriage is slowly braked until it stops completely. The point at which the second transport carriage stops is selected such that the second transport carriage advantageously stops when the substrates engage a guide external to the substrate carrier, but such that the substrate carrier does not collide with the substrate guides positioned external to the tank.

Advantageously, the first transport carriage is provided with a blade-like lifting device, also simply called "blade", which supports the substrates at one point so that only a point contact results. This contact point of the substrate leaves the fluid last during lifting. The blade shape has the advantage that the fluid present at this location on the substrates can be easily deflected by the blade, respectively, pointed shape. The blade is provided with notches which prevent a sliding of the substrate.

Expediently, the blade-shaped lifting device and the substrate carrier are lifted at the same velocity when the pin runs along the straight section of the control curve. This is the case when the substrates during lifting are still contained within the substrate carrier. The second transport carriage will be stopped only when the substrates engage the guides external to the substrate carrier.

In the case that a hood is arranged above the container, especially during a drying process, it is especially advantageous when the guide is provided at the inner sidewalls of the hood. The hood, which is primarily provided for covering the container, respectively, the tank, thus serves also for guiding the substrates when they are no longer engaged by the substrate carrier. Advantageously, the top side of the hood has connected thereto a diffusor plate in order to generate an isopropyl alcohol (IPA)/$N_2$ atmosphere for improving the drying process.

Advantageously, the inventive lifting apparatus is further provided with a releasable and lockable locking mechanism, which rigidly connects the first and the second transport carriages. The rigid connection between the first and second transport carriages corresponds to the movement of the pin of the jointed connection along the straight section of the control curve which is parallel to the movement direction. When the locking mechanism is locked, the substrate carrier can be lifted together with the substrates completely out of the tank, for example, when the transfer position of the substrate carrier is located at the upper portion of the tank and especially when the substrate carrier with the substrates is to be introduced into the tank or lifted from the tank. Advantageously, a cylinder is provided which locks or releases the locking mechanism for a simple control, especially when using the device as a module within a treatment system to be automatically loaded. Due to the releasable locking mechanism it is ensured that the transport carriages can be moved together for loading and unloading into the upper position, but can be separated for lifting the substrates from the substrate carrier.

The present invention has further the object to increase the yield for the manufacture of semi-conductor chips and/or wafers with the aforedescribed devices, to simplify the sequence of the method, and to improve the product quality.

This object is solved in connection with the aforementioned devices for systems in that a hood is provided above the tank and that the hood is provided with a drip protection device. Especially when at least two tanks for the treatment of substrates are arranged adjacent to one another, in conventional devices the problem occurs that during insertion or removal of wet substrates and/or substrate carriers droplets will fall onto the hoods of neighboring treatment tanks. When subsequently the hood is moved over the tank, for example, in order to remove substrates and/or substrate carriers from the tank that have been dried within the tank, there is a great risk that droplets will run down along the hood and will drip onto the already dried substrate. This disadvantage is eliminated by the inventive measure according to which the hood is provided with a drip protection device.

Preferably, the drip protection hood comprises a drip plate which is either connected to the upper side of the hood or which is in the form of a collar connected to the periphery of the hood. The arrangement of the drip plate, respectively, of the collar depends substantially on the spatial situation and is selected according to the space that is available.

According to one very advantageous embodiment of the invention, the plate, respectively, the collar projects past the outer dimensions of the hood whereby, according to one especially advantageous embodiment of the invention, the drip plate and/or the collar is slanted downwardly to that side of the hood toward which the hood upon opening of the tank is displaced. In this manner, it is ensured that on this side of the hood which is moved across the open tank no liquid can run and drip into this tank because the drip plate, respectively, the collar projects past the side wall of the hood and extends upwardly from the sidewall, respectively, from the upper side of the hood so that liquid cannot drip down. The liquid which is present on the hood, respectively, the droplets that run downwards along the sidewalls to the collar, are guided by the drip plate, respectively, the collar at a slant to the side of the hood which during opening and closing of the tank is not positioned over the open tank.

According to a further embodiment of the invention, a tank rim drip slant is provided at the side of the tank across which the hood is not displaced, which drip slant prevents that liquid can drip down onto the rim of the tank and contaminate, respectively, rewet it when, for example, substrates and substrate holder are transported across this area.

The aforementioned object is also solved in connection with the aforementioned devices and systems by providing the tank with a cleaning opening. During the treatment of substrates, especially wafers, within the tank, during treatment or during manipulation of the wafers, it happens that they break or that parts break off which remain within the tank. These remains must be removed in a complicated manner from the top. With the inventive measure, according to which the tank is provided with a cleaning opening, the removal of remains or broken wafers is substantially facilitated. Accordingly, the cleaning opening is advantageously closed by a flange which is detachable, preferably screwable, whereby the cleaning opening advantageously is connected to one side of the tank at or near the bottom of the tank. Thus, a direct access to the remains and wafer pieces within the tank is possible fast and in an uncomplicated manner.

The aforementioned object is also solved in connection with the aforementioned devices by providing within the vapor zone ionization for preventing electrostatic charging. In the vapor zone and especially also because of dripping occuring during the processes and flowing treatment fluids, such as distilled water etc., ions are present in the treatment space above the water surface, respectively, within the hood which closes off the tank in the upward direction, which ions result in electrostatic charging and damage to the substrates. Due to the electrostatic charging it is possible to have present very high electrostatic voltages which can result in breakthrough and thus can damage the substrates. By generating ions the electrostatic charging is reduced and damaging of the wafer by electrostatic charging is no longer possible. Within the vapor zone nitrogen and/or isopropyl alcohol are preferably present.

According to an advantageous embodiment of the system, the ionization device is provided within the vapor zone whereby the iozination device preferably comprises at least one ionization rod at at least one inner wall of the hood. Preferably, the ionization device comprises at least one counter electrode which is advantageously also arranged at the inner wall of the hood at a selected distance to the ionization rod, respectively to the ionization rods. The counter electrode is preferably connected to ground, respectively, to the terminal of a high voltage source whereby the other terminal is connected to the ionization rod.

The ionization rod is advantageously loaded with high voltage of 5 to 25 kV, preferably in a range of 10 to 15 kV.

According to an advantageous embodiment of the invention the high voltage is pulsed. The pulses preferably have a pulse length of 1 to 100 ms and preferably of 10 to 40 ms. Advantageously, the pulse duty ratio of the pulses is in the range of 1:8 to 1:12 and preferably approximately 1:10.

An improvement of the product quality can be achieved with the aforementioned devices such that at least one measuring probe for monitoring the gas concentration, the gas mixture proportions and/or the gas contents, respectively, gas mixture contents within the vapor zone is provided. Preferably, the data measured by the measuring probe are used for controlling the gas concentration, the gas mixture proportions and/or the gas contents, respectively gas mixture contents within the vapor zone. In this manner, it is possible to maintain over the entire manufacturing and treatment sequence optimal conditions within the vapor zone so that a high manufacturing quality and a low amount of products to be discarded is ensured.

The desired product quality according to a further inventive embodiment of the aforementioned devices can also be achieved by arranging within a line, via which the treatment fluid is withdrawn, a flow meter for determining the throughput of the treatment fluid. Thus, it is possible to determine deviations of the amount of throughput quickly and/or to use the data measured by the flow meter for controlling the amount of fluid to be introduced or withdrawn. In the inlet line and/or outlet line it is thus advantageous to provide a valve, especially a motor-controlled valve whereby the motor, respectively, the valve is controlled as a function of the measured data of the flow meter.

In the aforementioned devices the manufacturing costs are inventively kept minimal by recycling the treatment fluid flowing out of the tank in a recycling device. This reduces not only the manufacturing cost but also increases the environmental safety of the method. The recycled fluid is preferably reused in the fluid tank. The entire recycled fluid or a portion thereof can also, after recycling, be released into the used water sewage system. This is especially advantageous when the fluid is distilled water resulting from a drying process of the substrates, that, after recycling, can be without problems introduced into the communal sewage system.

Preferably, the inventive lifting apparatus is to be used in a drying process. Here, the substrates are lifted out of a rinsing liquid and the substrate carrier remains within the tank. Subsequently, the liquid level is lowered below the substrate carrier which can be effected, for example, by opening an outlet. Subsequently, the dry substrates are again lowered into the also dry substrate carrier. The drying of the substrates is effected also during lifting of the substrates from the tank while the substrate carrier is dried due to lowering the liquid level of the rinsing fluid.

BRIEF DESCRIPTION OF THE DRAWINGS

The invention as well as further details and advantages thereof will be explained in detail in the following with the aid of embodiments while referring to the drawings. It is shown in.

DESCRIPTION OF THE PREFERRED EMBODIMENTS

Figure 1:
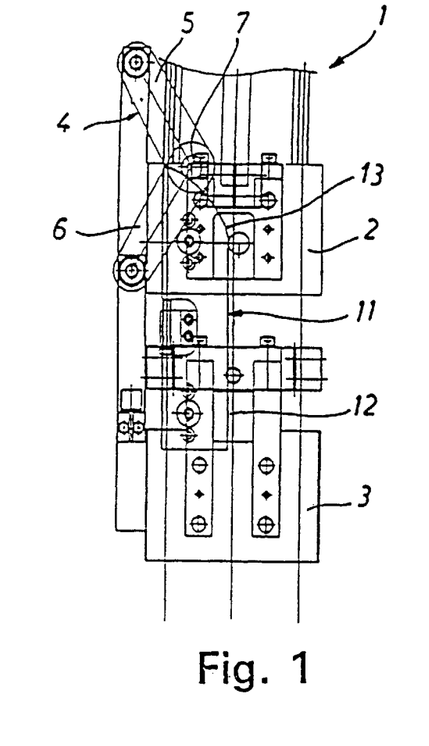
FIG. 1 a view of the back side of an embodiment of a lifting apparatus for an inventive drying system.
Figure 2:
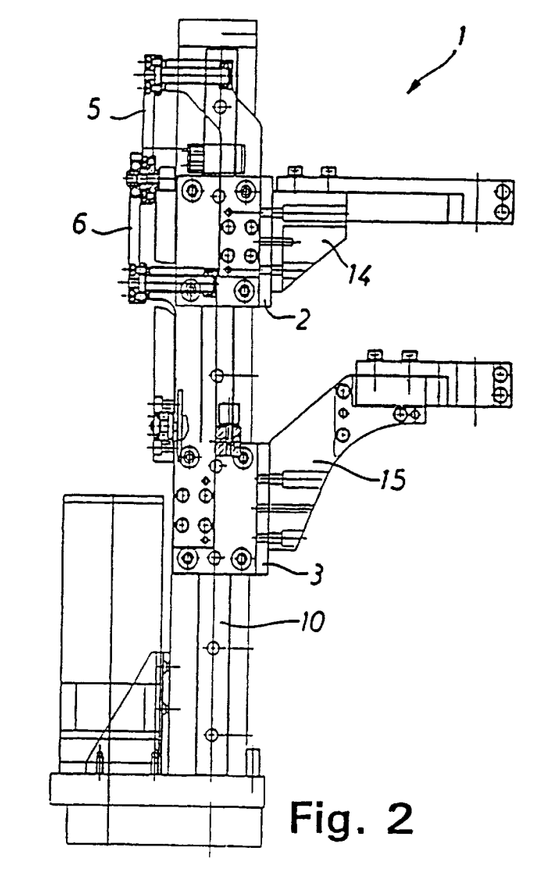
FIG. 2 a side view of the lifting apparatus of FIG. 1.
Figure 3:
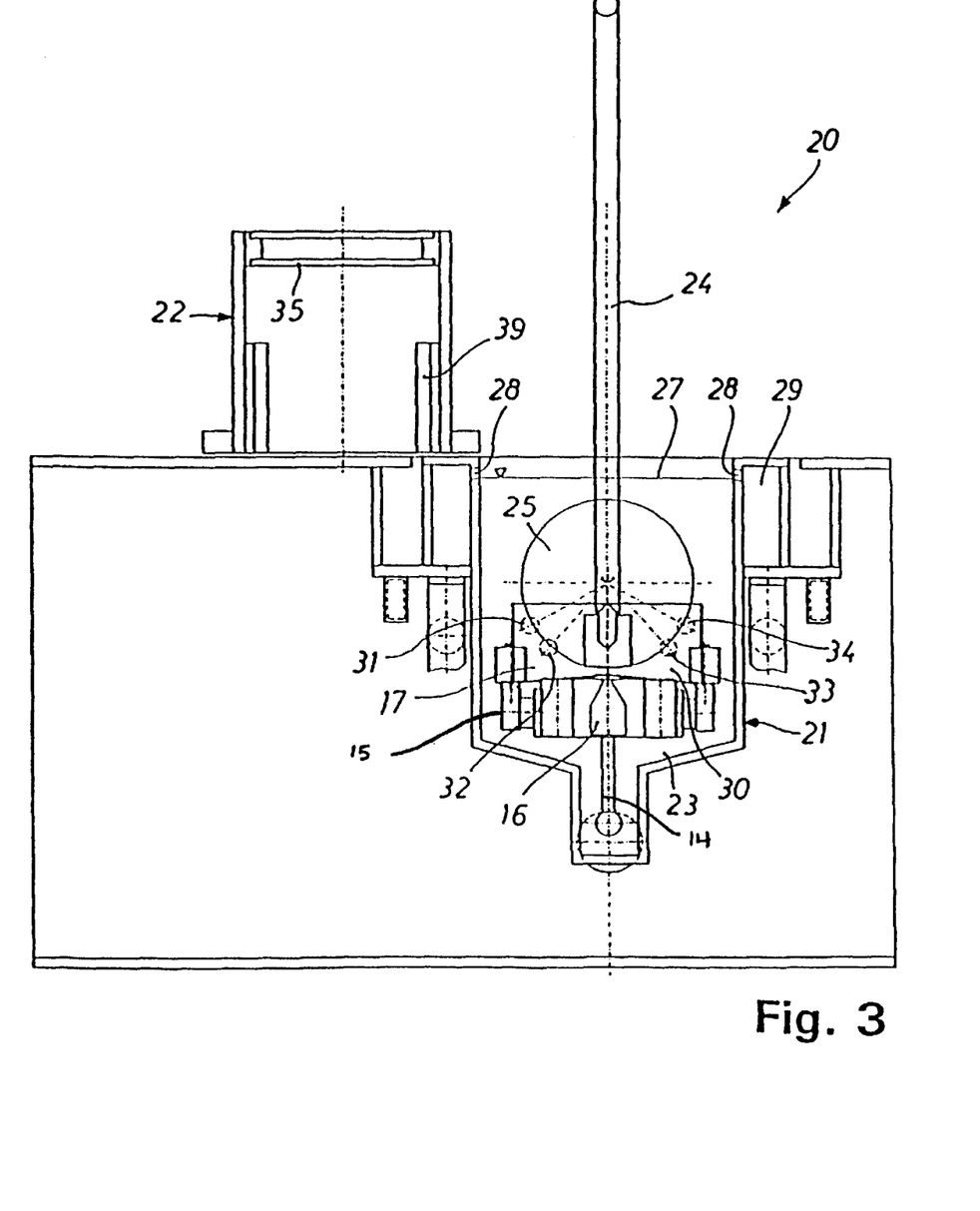
FIG. 3 a cross-sectional view of the drying device for chemical wet treatment, showing at the same time a first step of the inventive drying method.

In FIGS. 1 and 2 a lifting apparatus 1 of the inventive device 20 for drying wafers 25 according to FIG. 3 is represented. The lifting apparatus 1 comprises a first transport carriage 2 with a support arm 14 for a blade-shaped lifting device 16 and a second transport carriage 3 with a support arm 15 for the substrate carrier 17 which are connected by a jointed connection 4. The jointed connection 4 comprises a first leg 5 and a second leg 6 that jointedly connect the first transport carriage 2 and the second transport carriage 3. The two legs 5, 6 are connected to one another with a pin 7. The first transport carriage 2 is driven by a non-represented motor and pulls during lifting via the jointed connection 4 the second transport carriage 3 along a guide track 10 in the upward direction 10. The pin 7 runs along a control curve 11 which is comprised of a straight section 12 and a curved section 13.

When the pin 7 moves along the straight section 12, the jointed connection 4 substantially forms a rigid connection between the first and the second transport carriages 2, 3. In this state, the substrate carrier 17 with the wafers 25 contained therein is lifted, while the blade-shaped lifting device 16 does not yet come into contact with the wafers 25. At the beginning of the curved section 13 of the control curve 11 the second transport carriage 3 is gradually slowed relative to the first transport carriage 2. Thus, the blade-shaped lifting device 16 comes into contact with the wafers 25 and lifts them from the supports within the substrate carrier 17. At this point in time the wafers 25 are already supported by the guides 39 within the hood 22, as is shown in the FIG. 5 to be described infra. The transport carriage 3, however, does not completely stop but follows according to the curve of the curved section 13 the movement of the first transport carriage 2 because the legs 5, 6 have the opportunity to rotate about the pin 7 in order to thereby continuously enlarge the angle between them. The point in time of standstill of the second transport carriage 3 is reached when the pin 7 reaches a location of the curved section 13 at which a transition into an arc is provided the radius of which corresponds to the distance between the axis of the pin and the axis of rotation of the connecting points between the second leg and the second transport carriage 3. The own weight of the transport carriage thus causes the standstill.

The radius of the area of the curved section 13 which is located between the straight section 12 and the point at which standstill occurs is greater than the radius of the area of the curved section 13 after the point at which standstill occurs.

In FIGS. 3 to 10 the sequence of the drying process by using the lifting device 1 which is not represented in these drawings is shown. In FIGS. 3 to 10 same reference numerals indicate same elements.

According to FIG. 3 the inventive device 20 comprises a container or tank 21 across which a hood 22 can be laterally moved. Within the tank 21 a blade-shaped lifting device 16 is shown which is supported by the substrate arm 14.

The substrate carrier 17 with wafers 25 arranged therein is placed with the aid of a device handler 24 onto the lifting apparatus 1 positioned in its lowest end position. A rinsing fluid 23 flows from the bottom into the tank 21 and flows over the spillway edge 28 into an outer container 29. Since the lifting apparatus 1 is positioned in its lowest end position, the wafers 25 are completely immersed in the rinsing fluid 23.

The substrate carrier 17 comprises two parallel side plates of which only side plate 30 is shown in an end view in FIG. 3. Between the side plates four rods 31, 32, 33, 34 with transverse slots for receiving the wafers 25 are connected. Details of such a low mass carrier are disclosed in German Offenlegungsschrift 44 28 169 which is not a prepublished document; the contents of this disclosure is incorporated into this description in order to avoid repetition.

A gas is introduced from the top into the hood 22 and exits the drying space via the spillway openings of the tank.

The introduction of the gas provided for drying takes place via a longitudinal tube within the upper lid portion of the hood 22. The diffusor plate arranged between the longitudinal tube and the inner volume of the lid comprises a defined hole arrangement that provides for a uniform gas distribution over the width and length of the lid. When simultaneously a plurality of substrate carriers 17 are processed within the inventive device 20, partitions are preferably provided within the lid at the forward sides of the wafer packages which cause a uniform distribution of the gas for the entire space within the hood 22 for the individual wafer packages. Preferably, the gas is an $IPA/N_2$ mixture. Otherwise, different flow conditions may result so that individual wafers 25 of the packages could exhibit different drying results. For guiding the wafers 25 at the oppositely arranged inner side surfaces, guide slots 39 are provided. The guide slots 39 in the hood 22 are slanted by about 5°. Correspondingly, the substrate carriers 17 are lowered with the same slant angle into the tank 21. Thus, the position of the wafers 25 is defined during the entire drying process, and the drying of the substrate carrier is also improved.

Figure 4:
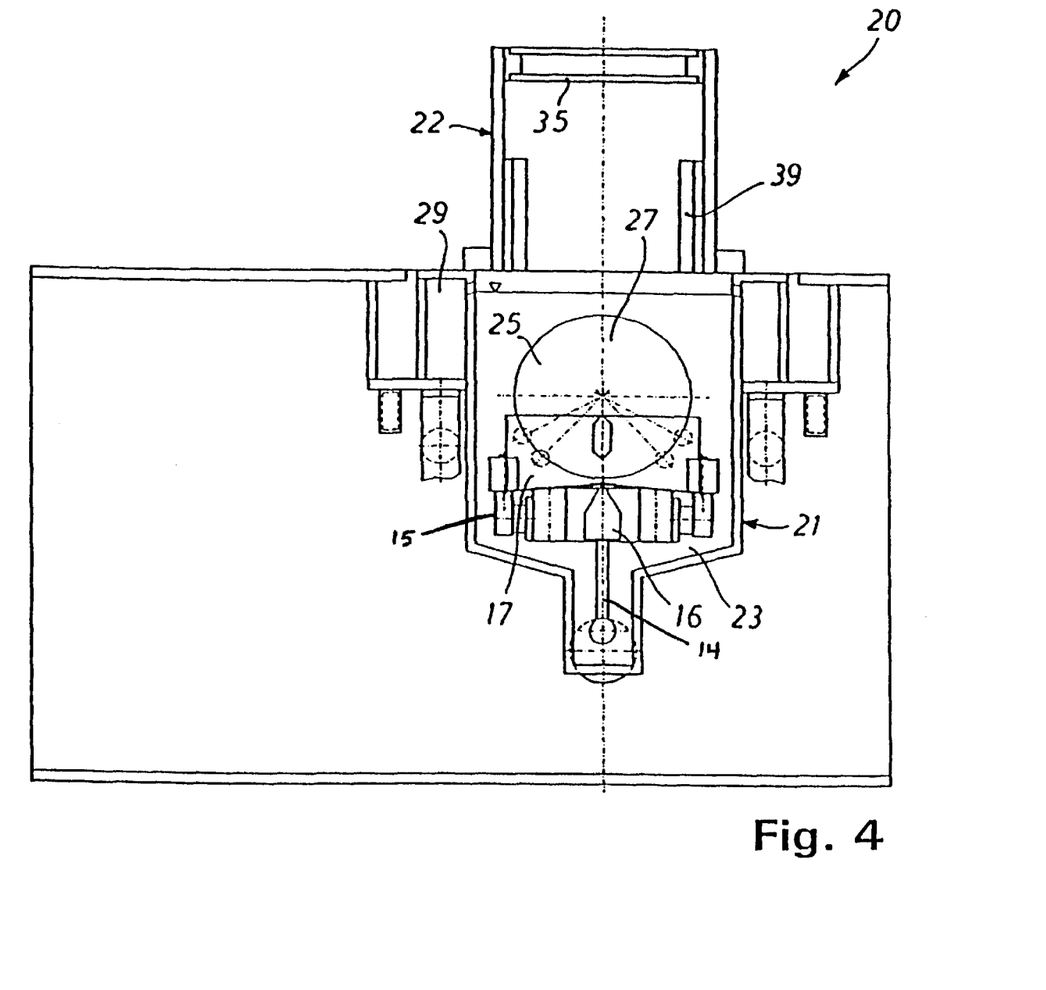
FIG. 4 a second step of the inventive drying method.

The representation of the inventive device according to FIG. 4 differs from the one in FIG. 3 only in that the hood 22 has been moved across the tank 21. Subsequently, the substrate carrier 17 with the wafers 25 is lifted.

The pin 7 thus follows, due to the drive of the first transport carriage 22, the straight section 12 of the control curve 11.

Figure 5:
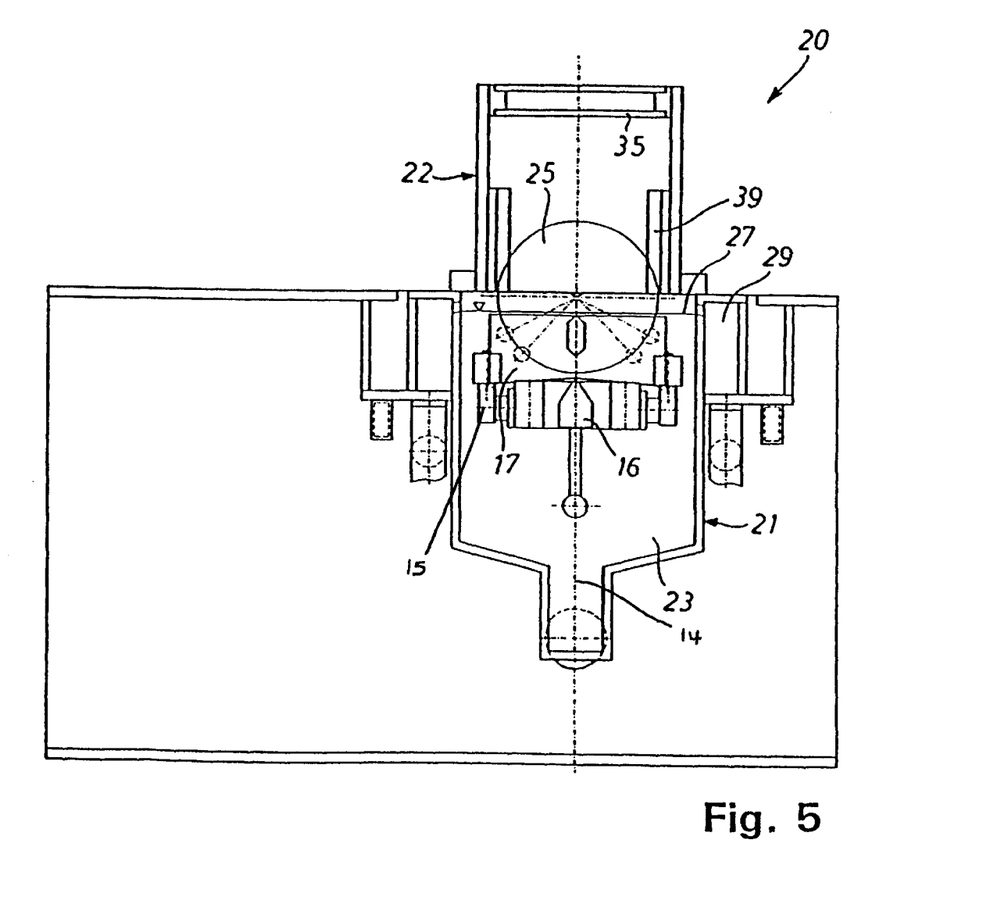
FIG. 5 a third step of the inventive drying process.

In FIG. 5, the point of the movement has been reached at which the pin 7 leaves the straight section 12 of the control curve 11 and enters the curved section 13 of the control curve 11. The shape and size of the control curve 11 is selected such that this point is reached when the wafer 25 comes into engagement with the lateral guides 39 in the hood 22 so that the substrate carrier 17 is no longer needed for guiding the wafers 25. The wafers 25 are then lifted by the blade-shaped lifting device 16.

After removal of the wafers 25 from the rinsing fluid 23 the wafers 25 are dried. The drying process is supported by the $IPA/N_2$ atmosphere above the tank 21 because the gas mixes with the rinsing fluid 23 on the substrates 25 and, due to the gradient present within the surface tension forces, prevents that a liquid film remains on the substrate 25.

Figure 6:
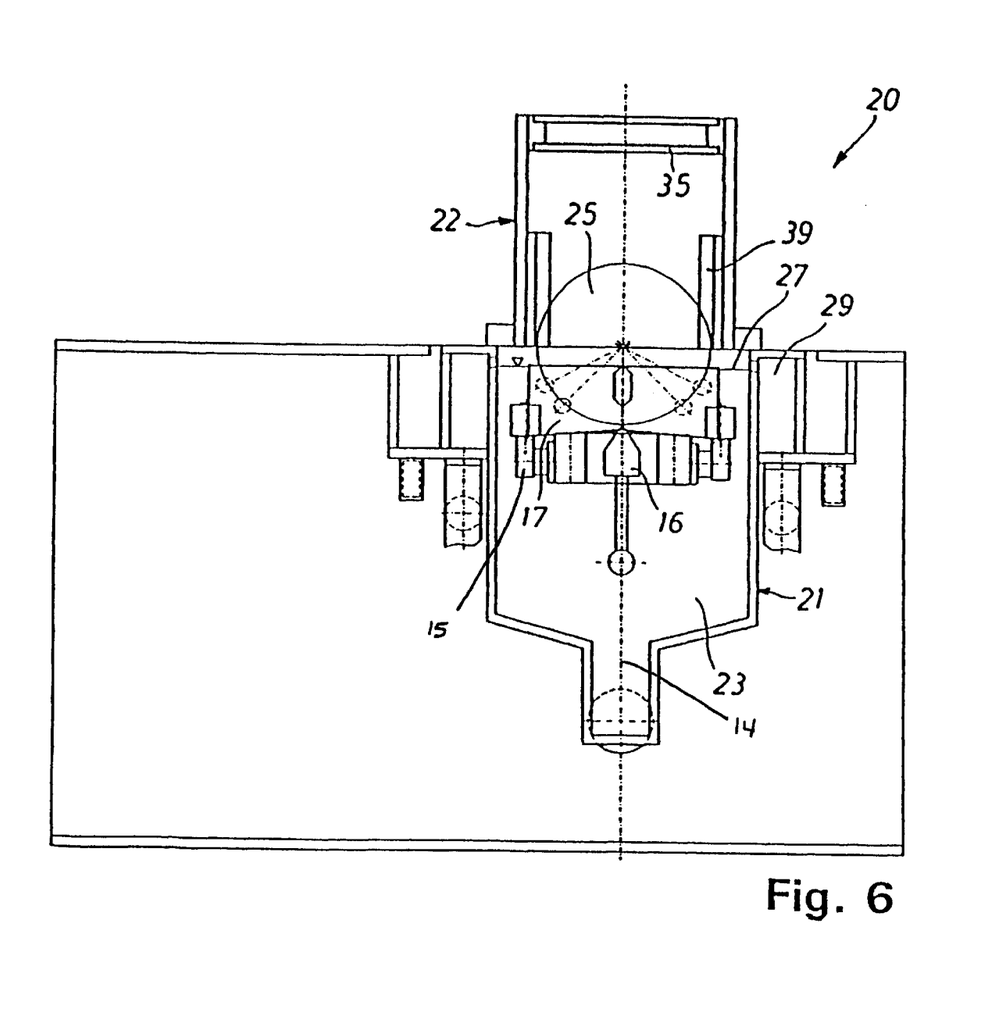
FIG. 6 a fourth step of the inventive drying process.

According to FIG. 6 the substrate carrier 17 is gradually slowed down relative to the blade-shaped lifting device 16. Thus, the blade-shaped lifting device 16 takes over in order to further lift the wafer 25 from the tank 21.

Figure 7:
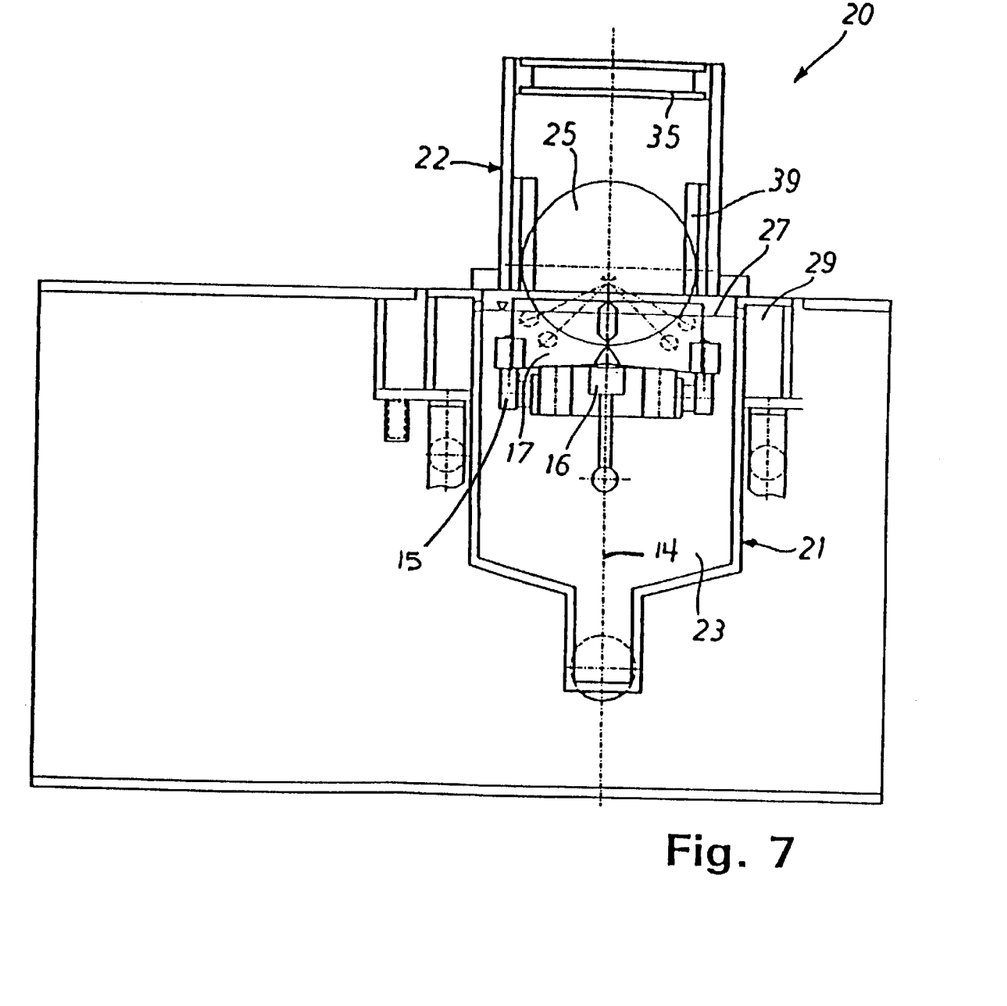
FIG. 7 a fifth step of the inventive drying method.

In FIG. 7, the position of the substrate carrier 17 is shown in which it is completely stopped and only the blade-shaped lifting device 16 is moved upwardly. Thus, the substrate carrier 17 is not forced into the guides 39 of the hood 22 which otherwise would result in damage to the guides and a destruction of the substrate carrier 17.

Figure 8:
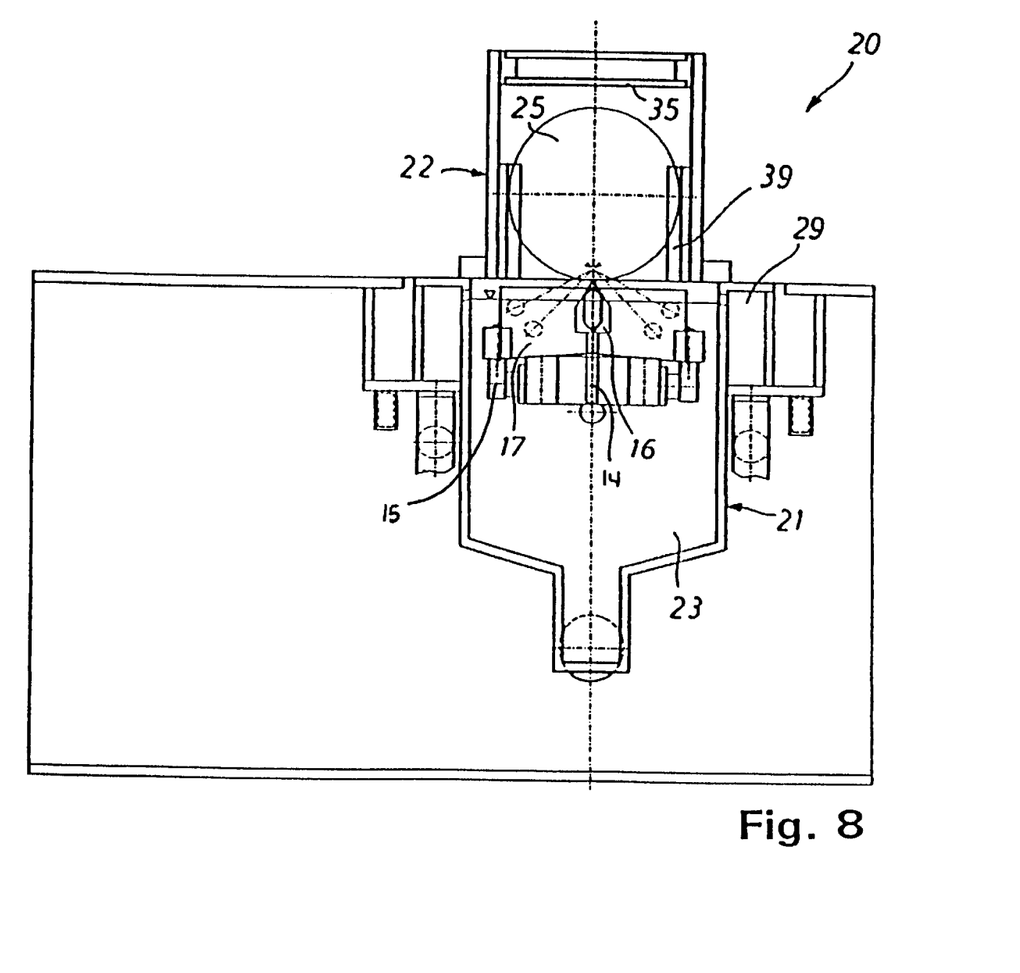
FIG. 8 a sixth step of the inventive drying method.

FIG. 8 shows the end of the drying process of the substrates 25. The wafers 25 have reached the highest point of their movement and are now completely lifted to a position above the liquid level 27. In order to dry the substrate carrier 17, the liquid level is lowered by opening an outlet. The wafers 25 and the substrate carrier 17 are now within an IPA/N$_2$ atmosphere.

Figure 9:
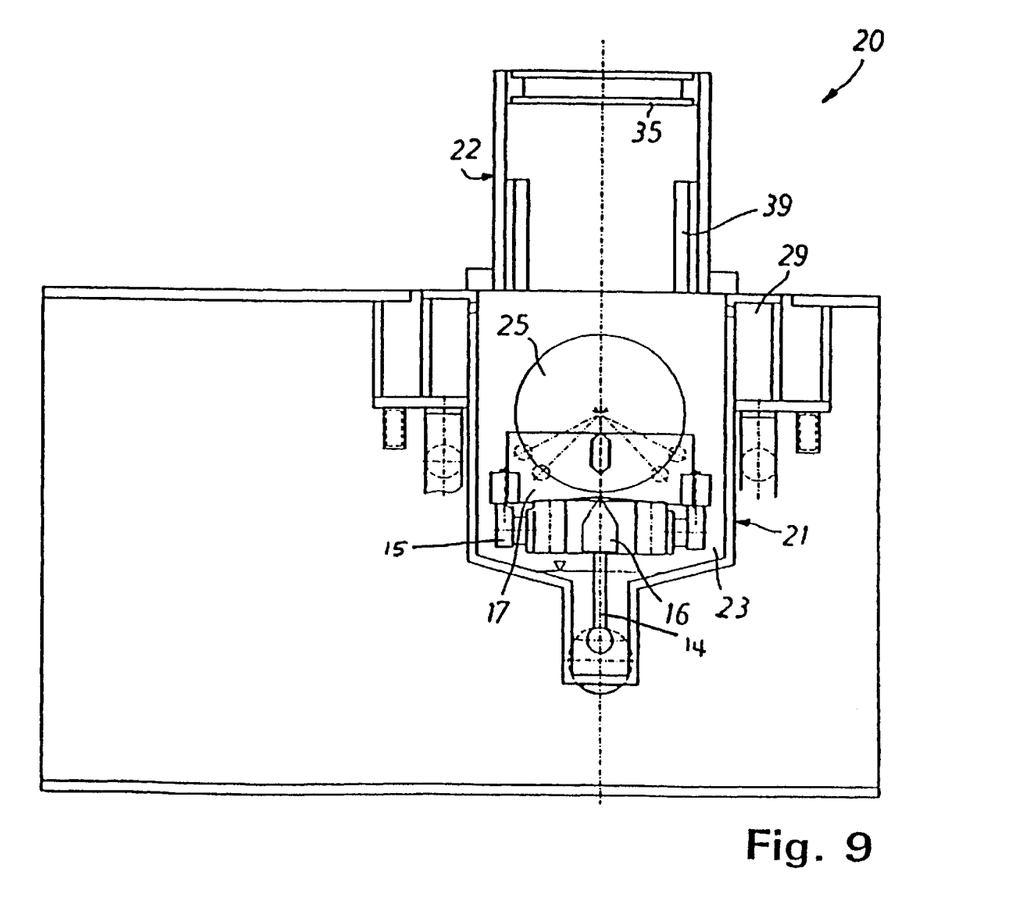
FIG. 9 a seventh step of the inventive drying method.

In FIG. 9 the liquid level 27 of the rinsing liquid 23 is lower than the substrate carrier 17. In the meantime, the movement that has been previously described in connection with FIGS. 4 to 7 has been carried out in reverse sequence so that the substrate arm 14 and the substrate carrier arm 15 are again positioned in their lower end positions. The wafers 25 and the substrate carriers 17 are now dry.

Figure 10:
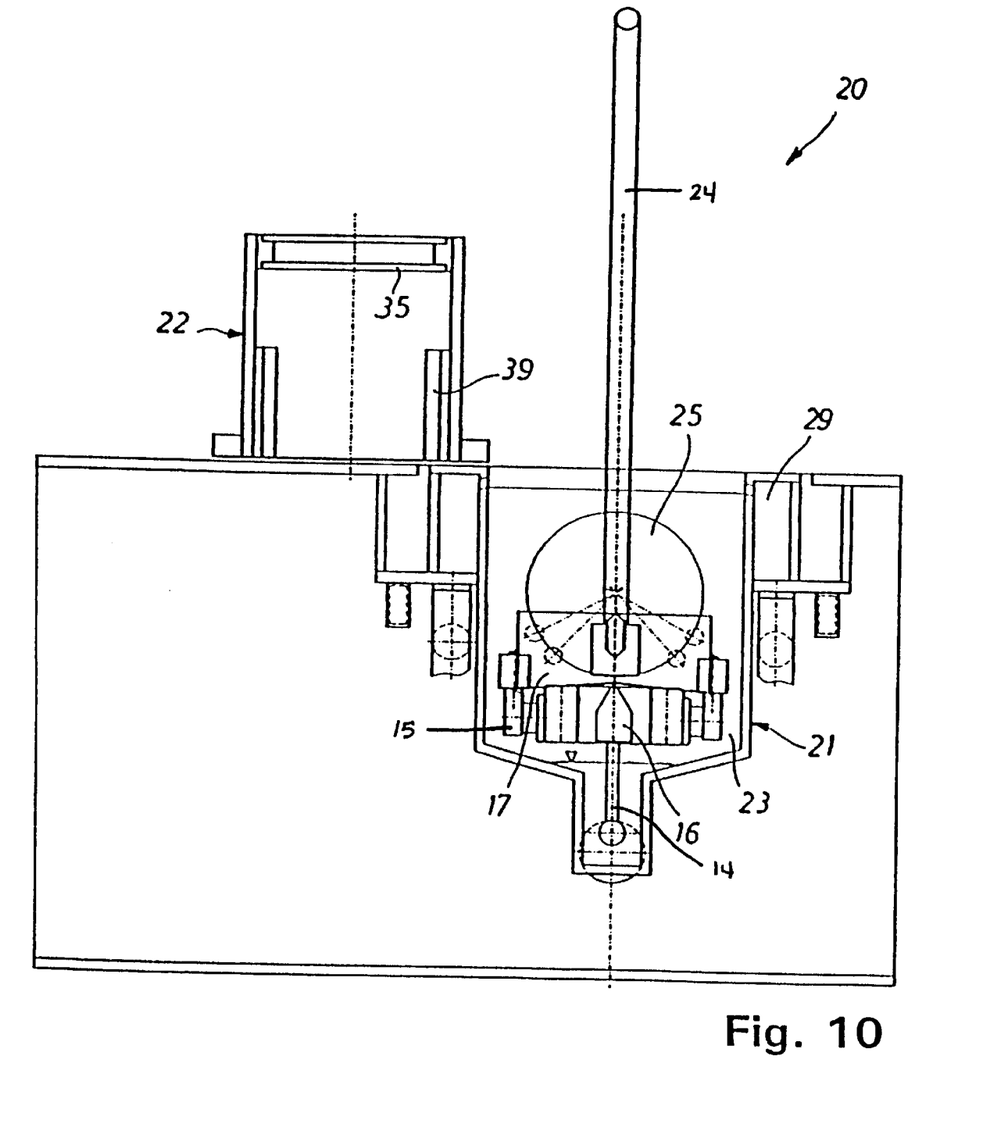
FIG. 10 an eighth step of the inventive drying process.

According to FIG. 10, the hood 22 is laterally displaced so that the substrate carrier 17 with the wafers 25 can be removed from the tank 21 by the device handler 24.

Figures 11, 12:
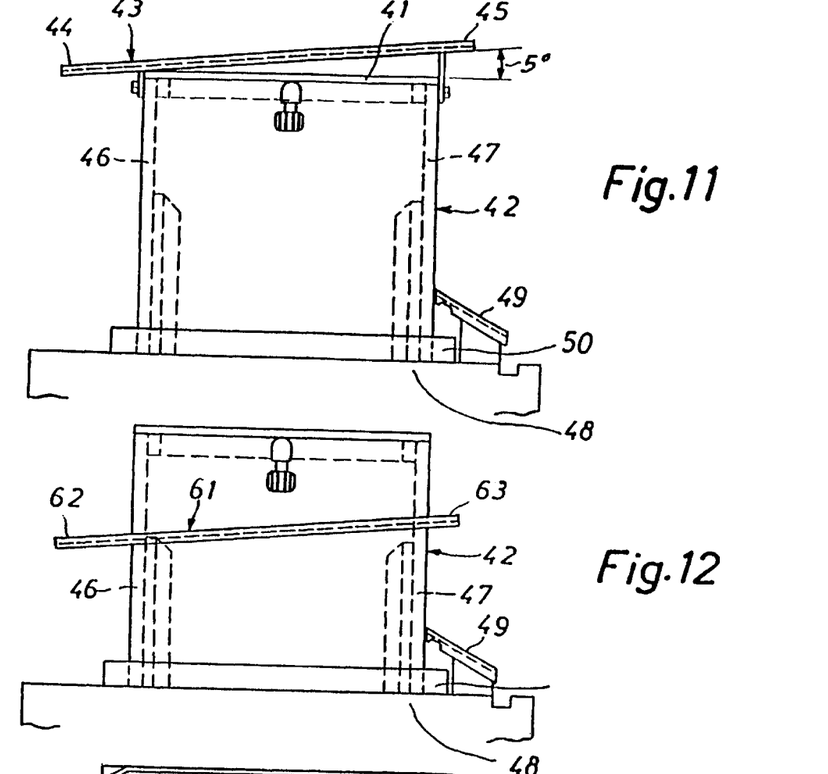
FIG. 11 one embodiment of the inventive device in a schematic representation with drip plate at the hood.
FIG. 12 A further embodiment of the inventive device with a drip protection device in the form of collar surrounding the hood.

In the embodiment represented in FIG. 11 of a device for chemically treating substrates, above an upper wall 41 of a hood 42 a drip protecting device in the form of a drip plate 43 is provided which is positioned at an angle of, for example, 5° relative to the upper wall 41 of the hood 42. The cover plate 43 extends with its lateral ends 44, 45 past the sidewalls 46, 47 of the hood 42. Especially when at least two treatment tanks are arranged adjacent to one another, substrates, respectively, substrate carriers which are wetted by liquid are transported across the hood 42 so that it cannot be avoided that liquid will drip onto the hood 42, respectively, according to the present invention, onto the drip plate 43. Without the presence of the drip plate 43 this liquid would flow along the sides 46, 47 of the hood 42 and, when opening the hood 42, for example, by displacement to the left, would drip especially from the sidewall 47 into the tank 48 (only represented schematically) in which a different treatment fluid or already dried substrates and/or substrate carriers are present so that the treatment fluid would be contaminated, respectively, the already dried substrates or substrate carriers would be rewetted. The thus resulting disadvantages, for example, more frequent exchange of the treatment fluid or greater numbers of products to be discarded due to the rewetting of the wafers are thus inventively prevented by the drip plate 43. The drip plate 43 prevents running of droplets along the sidewalls 46, 47 of the hood 42 and especially along the side surface 47 which will be upon displacement of the hood 42 to the left for opening the tank 48 across the open tank 48. Due to the slanted downward direction of the drip plate 43 in the direction toward the side toward which the hood 42 is displaced, the liquid runs, respectively, drips from the drip plate 43 within an area external to the tank and can thus not contaminate the tank 48.

In the represented embodiment an additional tank drip slant 49 is connected above the tank rim 50 of the side of the tank across which the hood 42 during opening of the tank is moved, via which liquid dripping onto the drip slant 49 is deflected and cannot reach the rim 50 of the tank.

Figure 13:
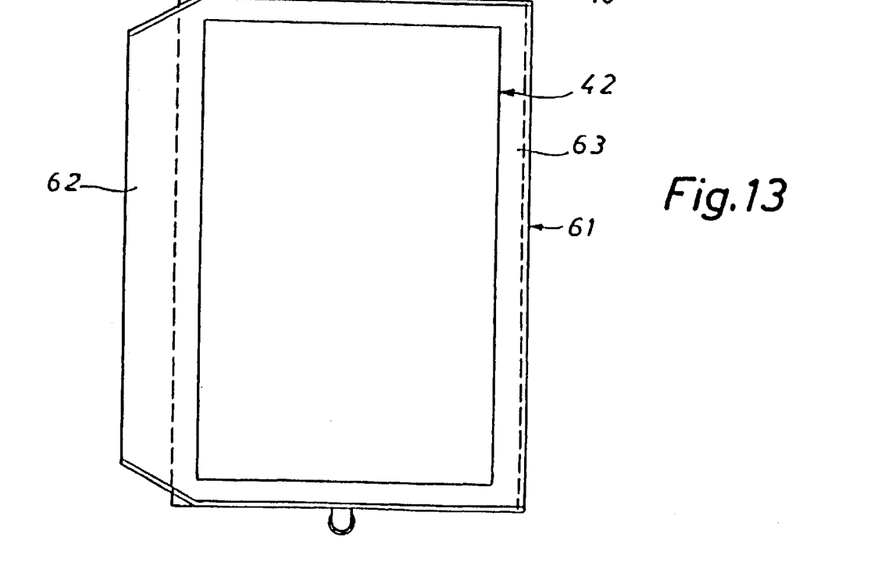
FIG. 13 The embodiment according to FIG. 12 in a plan view.

The embodiments represented in FIGS. 12 and 13 differ from the embodiment in FIG. 11 substantially only in that the drip protecting device in this case is in the form of a collar 61 which in the area of at least the sidewalls 46 and 47 of the hood 42 surrounds the hood 42 at least within the area of the sidewalls 46, 47. Due to the projecting areas 62, 63 of the collar 61, as has been disclosed in detail in connection with FIG. 11, it is ensured that upon opening of the tank 48 by displacement of the hood 42 in the plane of the drawing to the left liquid which drips from the top onto the hood 42 cannot reach the sidewalls 46, 47 and cannot drip into the open tank 48. The slanted portion 49 represented in FIG. 12 corresponds substantially to the one of FIG. 11 and has the same function.

Figure 14:
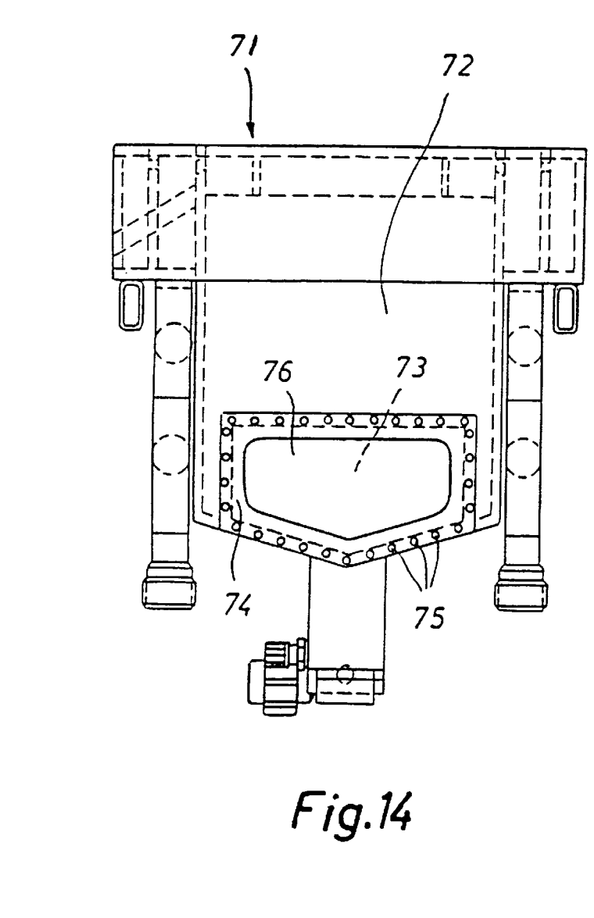
FIG. 14 a side view of an embodiment of the inventive device with a cleaning opening at the tank.
Figure 15:
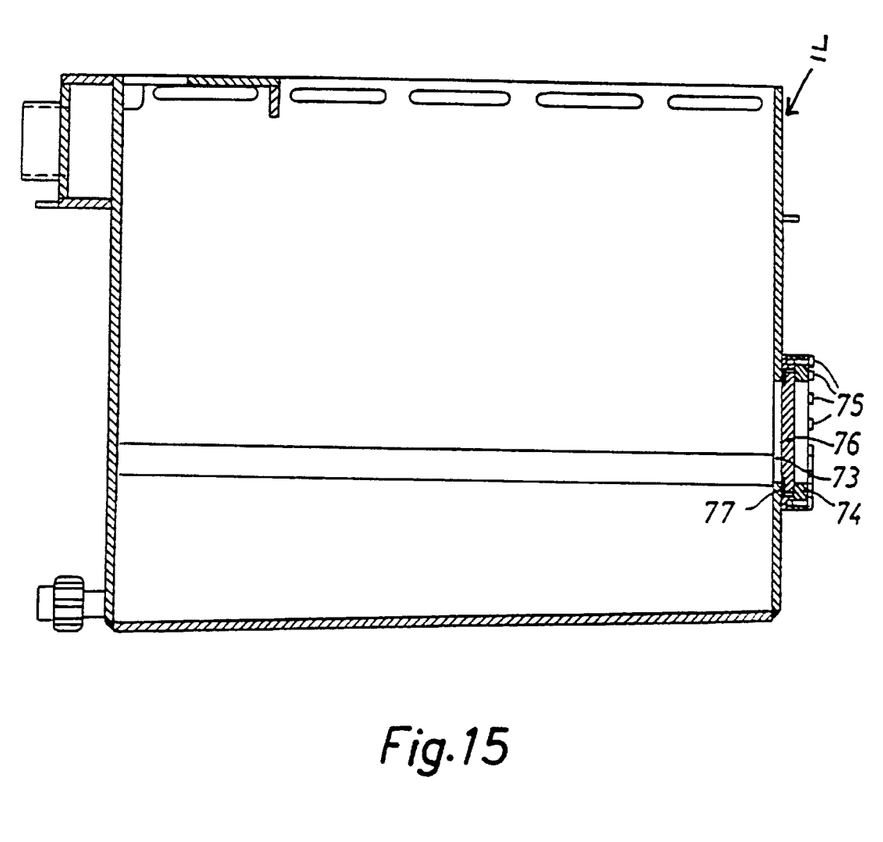
FIG. 15 a schematic cross-sectional view along the section line I—I in FIG. 14.

In the embodiments represented in FIGS. 14 and 15 the tank 71 is provided at its narrow side 72 with a cleaning opening 73 that is cut out at the lower end within the vicinity of the bottom of the tank.

As can be seen especially in connection with FIG. 15, the cleaning opening 73 is closed off with a removable flange 74 and can be connected to the tank 71 with screws 75. Between the flange 74 and the tank 71 an intermediate flange 76 is provided in the represented embodiment. For sealing the edges of the flanges 74 and/or the intermediate flange 76 a peripheral seal 77 is provided.

The cleaning opening 73 in the tank 71 allows for a simple cleaning of the bottom of the tank and the easy removal of remains or broken substrates.

Figure 16:
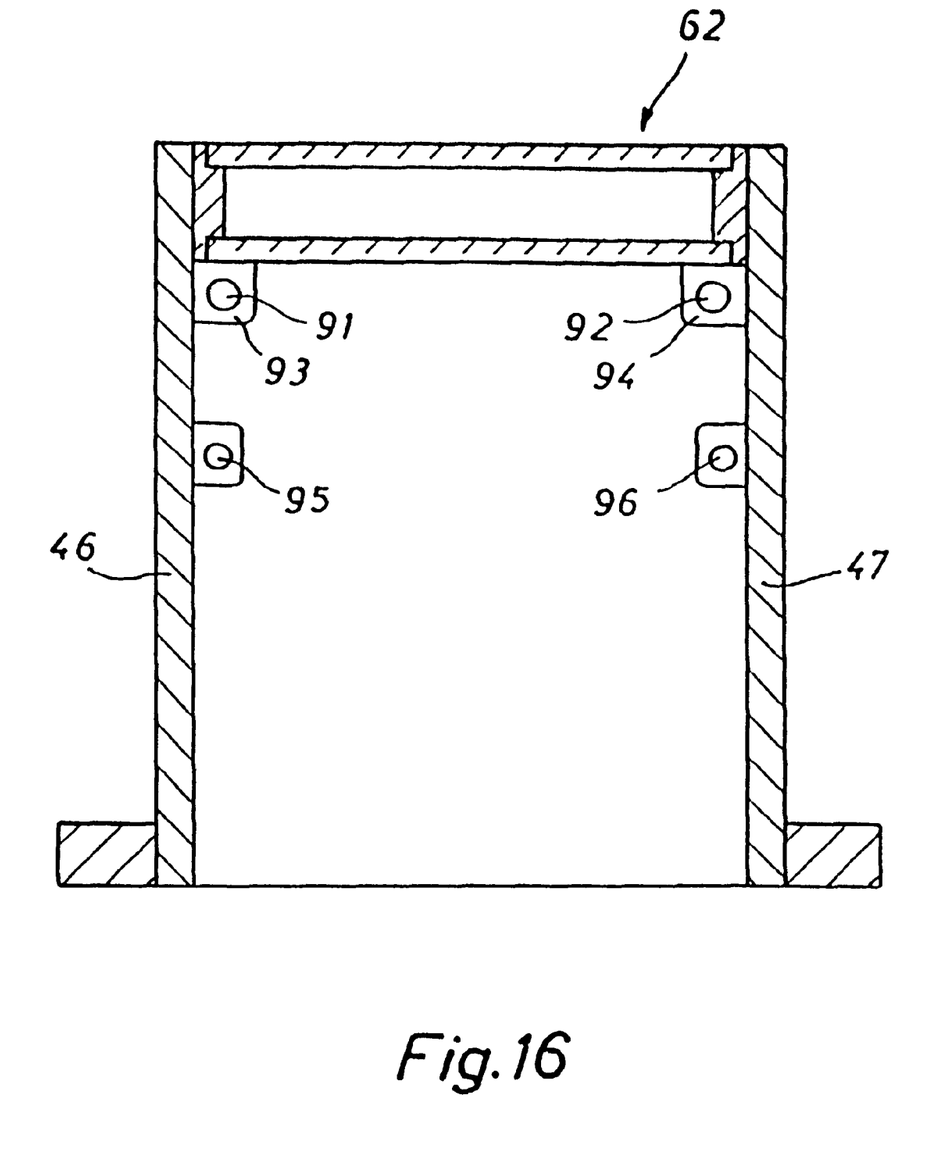
FIG. 16 an embodiment of the hood with an ionization device in a schematical representation.

The embodiment represented in FIG. 16 shows an ionization device with ionization rods 91, 92 at both sides 46, 47 of the hood 42 which in this embodiment are fixed with fastening devices 93, 94 at the upper edge portion of the hood 42.

At a selected distance below the ionization rods 91, 92 counter electrodes 95, 96 are provided which are, for example, grounded or connected to mass.

By applying a high voltage between the respective ionization rods 91, 92 and the associated counter electrodes 95, 96 ions are generated which prevent an electrostatic charging of the substrate, the substrate carrier and/or of components of the treatment device. In this manner it is ensured that the disadvantages related to electrostatic charging such as breakthroughs or spark over do not occur and damages to the substrates are not possible.

The invention has been disclosed with the aid of preferred embodiments. However, to a person skilled in the art numerous deviations and other embodiments are obvious without deviating from the basic inventive principle. For example, it is possible to arrange the drip protecting device in the form of a drip plate 43 or a collar 61 at the hood 42 at a location that is higher or lower, depending on the respective spatial requirements, or to select the amount of slant according to the respective requirements. Furthermore, it is, for example, possible to provide a plurality of ionization rods 91, 92 and a plurality of counter electrodes 95, 96 and to distribute them over the treatment chamber in order to provide for an optimal, uniform ionization within the hood 42.

What we claim is:

1. A device for chemical wet treatment of substrates, said device comprising:

a tank containing a treatment fluid for treating substrates;

at least one substrate carrier for supporting substrates within said tank;

at least one substrate lifting device for lifting the substrates off said substrate carrier;

a lifting apparatus mounted in said tank for lifting and lowering said substrate carrier within said tank;

said lifting apparatus comprising a first transport carriage connected to said substrate lifting device;

said lifting apparatus comprising a second transport carriage connected to a holder of said substrate carrier;

said first transport carriage and said second transport carriage connected to one another by a jointed connection, wherein said jointed connection couples movement of said transport carriages and allows relative movement of said transport carriages to one another.

2. A device according to claim 1, further comprising a vertical guide track and a drive device, wherein said first and said second transport carriages are movable along said vertical guide track and wherein said drive device is connected to said first transport carriage.

3. A device according to claim 1, wherein said lifting apparatus comprises a control curve and wherein said jointed connection comprises a first leg, a second leg, and a pin, wherein a first end of said first leg is connected to said first transport carriage, wherein a first end of said second leg is connected pivotably to said second transport carriage, wherein a second end of said first leg and a second end of said second leg are pivotably connected to one another by said pin, wherein said pin has a projecting portion engaging said control curve.

4. A device according to claim 3, wherein said control curve comprises a straight section extending parallel to a direction of movement of said first and second transport carriages and a curved section connected to the straight section.

5. A device according to claim 4, wherein a distance between said first and second transport carriages is constant when said pin runs in said straight section and wherein the distance between said first and second transport carriages increases when said pin runs in said curved section.

6. A device according to claim 5, wherein said curved section has a shape selected such that the distance between said first and second transport carriages increases constantly and such that, in an end portion of said curved section, said second transport carriage is slowly brought to a standstill.

7. A device according to claim 3, further comprising guides for the substrates exterior to said substrate carrier, wherein said substrate lifting device is blade-shaped, wherein said substrate lifting device and said substrate carrier are lifted at the same speed when said pin runs in said straight section, and wherein said second transport carriage is stopped when the substrates engage said guides exterior to said substrate carrier.

8. A device according to claim 7, wherein after standstill of said second transport carriage the substrates are lifted by said blade-shaped lifting device.

9. A device according to claim 7, further comprising a hood positioned above said tank, wherein said guides are located in said hood.

10. A device according to claim 9, wherein said hood comprises a means for introducing a gas or a gas mixture for exposing the substrates or the substrate carrier or both the substrates and the substrate carrier during drying of the substrates to the gas or gas mixture.

11. A device according to claim 10, further comprising at least one measuring probe for monitoring at least one of the parameters gas concentration, gas mixture proportion, gas contents, and gas mixture contents in a vapor zone within said hood.

12. A device according to claim 9, wherein said hood comprises a drip protecting device.

13. A device according to claim 12, wherein said drip protecting device is a drip plate arranged at a top side of said hood.

14. A device according to claim 9, further comprising an ionization device located in said hood above said tank.

15. A device according to claim 1, further comprising an arrestable and releasable locking mechanism for rigidly connecting said first and said second transport carriages.

16. A device according to claim 1, wherein said tank comprises a cleaning opening.

17. A device according to claim 1, further comprising:

a line connected to said tank for removing the treatment fluid; and a flow meter connected in said line for detecting the throughput of the treatment fluid.

18. A device according to claim 17, further comprising a recycling device for recycling the treatment fluid flowing out of said tank.

19. A drying method employed in connection with a device for chemical wet treatment of substrates, wherein the device has a tank containing a treatment fluid for treating substrates, at least one substrate carrier for supporting substrates within the tank, at least one substrate lifting device for lifting the substrates off the substrate carrier, a lifting apparatus for lifting and lowering the substrate carrier within the tank, the lifting apparatus comprising a first transport carriage connected to the substrate lifting device and comprising a second transport carriage connected to a holder of the substrate carrier, the first and second transport carriages connected to one another by a jointed connection; said method comprising the steps of:

lifting the substrate from a rinsing fluid and leaving the substrate carrier within the tank;

lowering the rinsing fluid level below the substrate carrier; and lowering the substrates into the substrate carrier after completion of the drying process.

\* \* \* \* \*